United States Patent
Lee et al.

(10) Patent No.: US 10,942,604 B2
(45) Date of Patent: Mar. 9, 2021

(54) TOUCH SENSING DEVICE AND DISPLAY APPARATUS INCLUDING THE SAME

(71) Applicant: SILICON WORKS CO., LTD., Daejeon (KR)

(72) Inventors: Hee Jin Lee, Daejeon (KR); Jae Hwan Lee, Daejeon (KR); Jeong Kwon Nam, Daejeon (KR); Kyu Tae Lee, Daejeon (KR); Hyun Soo Chung, Daejeon (KR); Jin Yoon Jang, Daejeon (KR); Hee Ra Yun, Daejeon (KR); Kyung Min Shin, Daejeon (KR); Mun Seok Kang, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/718,632

(22) Filed: Dec. 18, 2019

(65) Prior Publication Data
US 2020/0210020 A1 Jul. 2, 2020

(30) Foreign Application Priority Data
Dec. 27, 2018 (KR) .......................... 10-2018-0170722

(51) Int. Cl.
G06F 3/041 (2006.01)
G06F 3/044 (2006.01)
H03F 3/45 (2006.01)

(52) U.S. Cl.
CPC ............ *G06F 3/0418* (2013.01); *G06F 3/044* (2013.01); *G06F 3/04182* (2019.05);
(Continued)

(58) Field of Classification Search
CPC ...... G06F 3/0418; G06F 3/044; G06F 3/0412; G06F 3/041; G06F 3/0416;
(Continued)

(56) References Cited

U.S. PATENT DOCUMENTS

2013/0063395 A1* 3/2013 Byun .................. G06F 3/04184
345/174
2013/0214749 A1* 8/2013 Huang .................... G05F 1/595
323/271
(Continued)

FOREIGN PATENT DOCUMENTS

KR 10-2013-0028628 A 3/2013
KR 10-2018-0072313 A 6/2018

*Primary Examiner* — Xuemei Zheng
(74) *Attorney, Agent, or Firm* — Harness, Dickey & Pierce, P.L.C.

(57) ABSTRACT

Disclosed is a touch sensing device for preventing touch sensing performance from being reduced by a parasitic capacitance. The touch sensing device includes a plurality of buffers buffering a difference between a reference signal and a reception signal received from a touch electrode and generating first and second currents corresponding to a buffered signal, a plurality of current mirror units generating a first output signal using a first mirror current generated through mirroring of the first current and a third mirror current generated through mirroring of the second current and generate a second output signal using a second mirror current generated through mirroring of the first current and a fourth mirror current generated through mirroring of the second current, and a plurality of integrators integrating a difference between the first output signal from an $n^{th}$ current mirror unit and the second output signal from an $(n-1)^{th}$ current mirror unit.

17 Claims, 5 Drawing Sheets

(52) U.S. Cl.
CPC ..... *H03F 3/45269* (2013.01); *H03F 3/45273* (2013.01); *H03F 2203/45512* (2013.01)

(58) Field of Classification Search
CPC ............. G06F 3/04182; H03F 3/45273; H03F 3/45475; H03K 17/164; H03K 17/302; H03K 17/667; H03K 17/693; H03K 19/00369; H03K 19/01707; H03K 19/0944

See application file for complete search history.

(56) References Cited

U.S. PATENT DOCUMENTS

2018/0172744 A1* 6/2018 Chang .................. G06F 3/03547
2018/0173365 A1* 6/2018 Dinu ..................... G06F 3/0418

\* cited by examiner

TOUCH SENSING DEVICE AND DISPLAY APPARATUS INCLUDING THE SAME

CROSS-REFERENCE TO RELATED APPLICATIONS

This application claims the benefit of the Korean Patent Application No. 10-2018-0170722, filed on Dec. 27, 2018, which is hereby incorporated by reference as if fully set forth herein.

FIELD

The present disclosure relates to a touch sensing device, and more particularly, to a touch sensing device for sensing a touch applied to a display panel.

BACKGROUND

With the advancement of information-oriented society, various requirements for display apparatuses for displaying an image are increasing. Recently, various types of display apparatuses such as Liquid Crystal Display (LCD) and Organic Light Emitting Diode (OLED) display are being practically used.

Recently, display apparatuses including a touch screen panel for sensing a touch input based on a stylus pen or a finger of a user are being widely used without depending on conventional input manners such as buttons, keyboards, and mouse devices. The display apparatuses including the touch screen panel include a touch sensing device for accurately detecting the presence of a touch and touch coordinates (a touch position).

The touch sensing device drives touch electrodes disposed in the touch screen panel to detect a touch sensing signal and detects touch information such as the presence of a touch or a touch position by using the touch sensing signal.

In a related art touch sensing device, an undesired parasitic capacitance may occur between touch driving patterns and peripheral conductors at the inside or outside of a touch screen in a process of driving the touch screen to sense a touch. When a touch is sensed as a capacitive type in a state where a parasitic capacitance occurs inside or outside the touch screen panel, touch sensitivity may be greatly reduced due to the parasitic capacitance. Such a problem may more severely occur in a case where the touch screen panel is embedded into a display panel.

Particularly, in plastic organic light emitting diode (pOLED) displays of which the use is increasing in smartphones and the like, as a thickness of each smartphone is progressively thinned, a high parasitic capacitance occurs between a touch screen panel and a cathode electrode of a plastic OLED. Due to the high parasitic capacitance, it is difficult to design a sensing amplifier based on a feedback factor of a touch sensing device for sensing a touch.

Moreover, since a feedback capacitor applied to a sensing amplifier of a touch sensing device should increase due to an increase in a parasitic capacitance, a design area of the touch sensing device increases, and moreover, an output signal of the sensing amplifier is reduced.

In addition, display noise may penetrate into a touch screen panel due to a parasitic capacitance, causing the degradation in signal noise ratio (SNR) characteristic.

SUMMARY

Accordingly, the present disclosure is directed to providing a touch sensing device and a display apparatus including the same that substantially obviate one or more problems due to limitations and disadvantages of the related art.

An aspect of the present disclosure is directed to providing a touch sensing device and a display apparatus including the same, which prevent touch sensing performance from being reduced by a parasitic capacitance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a touch sensing device including: a plurality of buffers buffering a difference between a reference signal and a reception signal received from a touch electrode through a touch sensing line and generating first and second currents corresponding to a buffered signal; a plurality of current mirror units respectively connected to the plurality of buffers to generate a first output signal using a first mirror current generated through mirroring of the first current and a third mirror current generated through mirroring of the second current and generate a second output signal using a second mirror current generated through mirroring of the first current and a fourth mirror current generated through mirroring of the second current; and a plurality of integrators integrating a difference between the first output signal output from an $n^{th}$ (where n is an integer of 2 or more) current mirror unit of the plurality of current mirror units and the second output signal output from an (n−1)th current mirror unit of the plurality of current mirror units.

In another aspect of the present disclosure, there is provided a touch sensing device including a first buffer connected to a first touch electrode through a first touch sensing line, the first buffer including a first output circuit including a first pull-up circuit having a cascode configuration and a first pull-down circuit having a cascode configuration; a first PMOS cascode mirror current generating circuit connected to the first buffer to generate a first mirror current by performing a mirroring operation on a first current flowing through the first pull-up circuit; a first NMOS cascode mirror current generating circuit connected to the first buffer to generate a third mirror current by performing a mirroring operation on a second current flowing through the first pull-down circuit; and an integrator integrating a difference between a predetermined reference signal and a first output signal generated by using the first mirror current and the third mirror current.

In another aspect of the present disclosure, there is provided a display apparatus including: a touch screen panel including a plurality of touch electrodes and a plurality of touch sensing lines connected to the plurality of touch electrodes to each transmit a reception signal corresponding to a capacitance generated in a corresponding touch electrode; and a touch sensing device connected to the plurality of touch sensing lines to sense whether a touch is applied thereto, wherein the touch sensing device comprises: a first buffer connected to a first touch electrode through a first touch sensing line, the first buffer including a first output circuit including a first pull-up circuit having a cascode configuration and a first pull-down circuit having a cascode configuration; a first PMOS cascode mirror current generating circuit connected to the first buffer to generate a first mirror current by performing a mirroring operation on a first current flowing through the first pull-up circuit; a first NMOS cascode mirror current generating circuit connected to the first buffer to generate a third mirror current by performing a mirroring operation on a second current flowing through the first pull-down circuit; and an integrator integrating a difference between a predetermined reference signal and a first output signal generated by using the first mirror current and the third mirror current.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
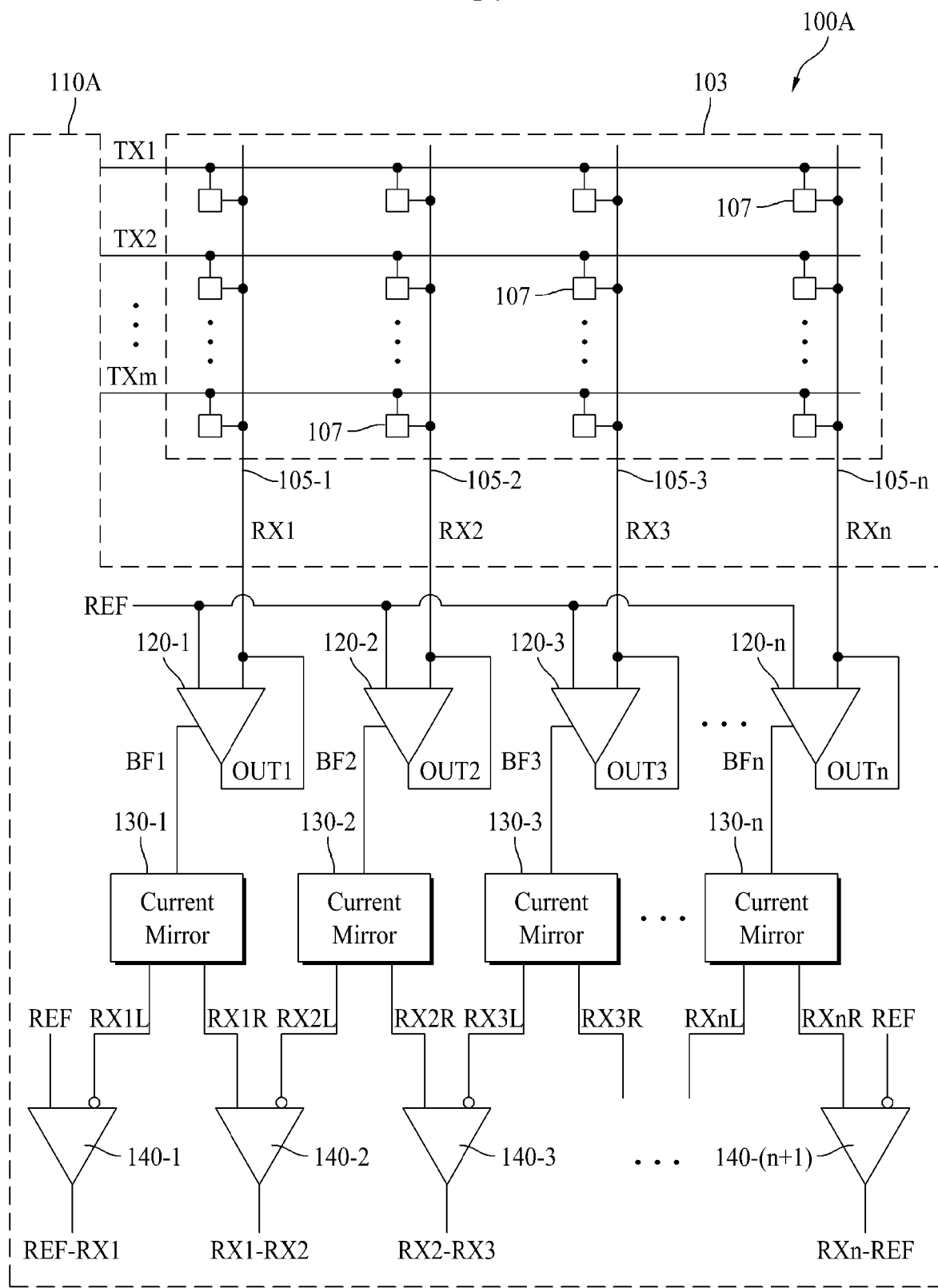
FIG. 1 is a block diagram of a display apparatus including a touch sensing device according to an embodiment of the present invention.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~' one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present invention will be described in detail with reference to the accompanying drawings.

FIG. 1 is a block diagram of a display apparatus including a touch sensing device according to an embodiment of the present invention. Referring to FIG. 1, the display device 100A may include a touch screen panel (TSP) 103 and a touch sensing device 110A. The touch sensing device 110A may be packaged as a semiconductor package.

The display device 100A may be a mobile device, and the mobile device may be implemented as a laptop computer, a smartphone, a Mobile Internet device (MID), or an Internet of things (IoT) device. In an embodiment, the display device 100A may be a display apparatus including a plastic organic light emitting diode (pOLED) display panel.

The touch screen panel 103 may include a plurality of touch driving lines TX1 to TXm (where m is an integer of 2 or more) through which a touch driving signal is transmitted, a plurality of touch electrodes 107, and a plurality of touch sensing lines 105-1 to 105-$n$ (where n is an integer of 2 or more) through which voltages (or electric charges) of the touch electrodes 107 are transmitted. Each of the touch electrodes 107 may include a mutual capacitor. The touch sensing lines 105-1 to 105-$n$ may denote sensing lines of the touch screen panel 103. In an embodiment, the touch screen panel 103 may be implemented as a type which is embedded into the display device 100A. For example, the touch screen panel 103 may be disposed as an on-cell type in the display device 100A.

In FIG. 1, the touch screen panel 103 is illustrated as a mutual-capacitive touch screen panel including the touch driving lines TX1 to TXm and the touch sensing lines 105-1 to 105-$n$. However, the present invention is not limited thereto and may be applied to a self-capacitive touch screen panel where the supply of the touch driving signal and reception of a capacitance generated based on a user touch or a touch of a stylus pen are performed through one touch sensing line.

The touch sensing device 110A senses a touch applied to the touch screen panel 103. In an embodiment, the touch sensing device 110A may supply the touch driving signal to the touch electrodes 107 to drive the touch electrodes 107 and may sense a variation of a capacitance caused by a touch applied to each of the touch electrodes 107. To this end, the touch sensing device 110A may further include a touch driving signal supply unit (not shown) which supplies the touch driving signal to the touch electrodes 107 through the touch driving lines TX1 to TXm.

The touch sensing device 110A may include a plurality of buffers 120-1 to 120-$n$ connected to the touch sensing lines 105-1 to 105-$n$, a plurality of current mirror units 130-1 to 130-$n$, and a plurality of integrators 140-1 to 140-($n$+1). In the drawings, a reference sign illustrated as a small circle may denote an inverting terminal.

The plurality of buffers 120-1 to 120-$n$ buffer a difference between a reference signal REF and each of reception signals RX1 to RXn respectively received through the touch sensing lines 105-1 to 105-$n$ and output buffered signals BF1 to BFn. Output terminals, outputting output signals OUT1 to OUTn, of the buffers 120-1 to 120-$n$ are respectively connected to input terminals, receiving the reception signals RX1 to RXn, of the buffers 120-1 to 120-$n$.

In an embodiment, each of the buffers 120-1 to 120-$n$ may be implemented as an operational amplifier having a voltage gain of 1. In this case, each of buffers 120-1 to 120-$n$ of a first stage may be a unit gain buffer, a unit gain amplifier, or a buffer amplifier.

According to an embodiment of the present invention, the touch sensing lines 105-1 to 105-$n$ are respectively and directly connected to the buffers 120-1 to 120-$n$, and thus, an additional circuit (for example, a multiplexer (MUX)) may not be needed between each of the buffers 120-1 to 120-$n$ and a corresponding touch sensing line of the touch sensing lines 105-1 to 105-$n$.

Moreover, according to an embodiment of the present invention, since the touch sensing lines 105-1 to 105-$n$ are respectively and directly connected to the buffers 120-1 to 120-$n$, signals may be simultaneously generated in all transmission channels. Here, each of the transmission channels may denote a circuit which includes a buffer, a current mirror unit, and an integrator each needed for processing the reception signals RX1 to RXn.

Therefore, comparing with a conventional time sequence manner where a touch sensing device sequentially senses transmission channels, a sensing time of the touch sensing device 110A may not increase or may be considerably shortened, and moreover, the degradation in signal quality caused by a time sequence-based sensing time difference may not occur or may be considerably reduced.

In a conventional method where one touch sensing line is connected to two channels and differential sensing is performed, there may be a problem where an amplitude of a sensing signal decreases by half. However, according to an embodiment of the present invention, since the touch sensing lines 105-1 to 105-$n$ are respectively and directly connected to the buffers 120-1 to 120-$n$, the amplitude of a sensing signal may not be reduced, and thus, a sensing signal having a high signal noise ratio (SNR) may be obtained.

Moreover, a first stage of each transmission channel may be configured with a plurality of buffers 120-1 to 120-$n$, thereby solving a problem where it is difficult to design an amplifier due to a limitation of a feedback factor caused by a high capacitance load (for example, difficulty caused by an amplification speed and current consumption) and a design area increases due to the use of a large feedback capacitor.

In addition, according to an embodiment of the present invention, the reference signal REF for single-ended conversion may be used in a first transmission channel and a last transmission channel, and thus, algorithm processing may be easily performed on the reception signals RX1 to RXn. For example, the algorithm may determine a transmission channel, where noise or a touch does not occur, between the first transmission channel and the last transmission channel and may selectively convert differential signals obtained on the determined transmission channel into a single-ended signal.

The plurality of current mirror units 130-1 to 130-$n$ may convert output signals BF1 to BFn, provided from the buffers 120-1 to 120-$n$, into currents and may provide converted currents to the integrators 140-1 to 140-$n$, respectively. In an embodiment, each of the current mirror units 130-1 to 130-$n$ may be a charge-to-current converter which converts an input electric charge into an output current.

The first current mirror unit 130-1 may copy a current flowing in an output circuit of the first buffer 120-1 to generate a pair of (or two) mirror currents RX1L and RX1R, the second current mirror unit 130-2 may copy a current flowing in an output circuit of the second buffer 120-2 to generate a pair of (or two) mirror currents RX2L and RX2R, and the $n^{th}$ current mirror unit 130-$n$ may copy a current flowing in an output circuit of the $n^{th}$ buffer 120-$n$ to generate a pair of (or two) mirror currents RXnL and RXnR.

In this case, the amounts of the two mirror currents RX1L and RX1R may be the same, the amounts of the two mirror currents RX2L and RX2R may be the same, and the amounts of the two mirror currents RXnL and RXnR may be the same.

The amount of each of the two mirror currents RX1L and RX1R may be adjusted by using first control signals, the amount of each of the two mirror currents RX2L and RX2R may be adjusted by using second control signals, and the amount of each of the two mirror currents RXnL and RXnR may be adjusted by using $n^{th}$ control signals.

The first integrator 140-1 integrates a difference between the reference signal REF and the mirror current RX1L of the first current mirror unit 130-1. Accordingly, an integral signal corresponding to a difference REF-RX1 between the reference signal REF and a first reception signal RX1 may be output from the first integrator 140-1.

The second integrator 140-2 integrates a difference between the mirror current RX1R of the first current mirror unit 130-1 and the mirror current RX2L of the second current mirror unit 130-2. Accordingly, an integral signal corresponding to a difference RX1-RX2 between the first reception signal RX1 and a second reception signal RX2 may be output from the second integrator 140-2.

The (n+1)$^{th}$ integrator 140-(n+1) may integrate a difference between a mirror current RXnR of the n$^{th}$ current mirror unit 130-n and the reference signal REF. Accordingly, an integral signal corresponding to a difference RXn-REF between a n$^{th}$ reception signal RXn and the reference signal REF may be output from the (n+1)$^{th}$ integrator 140-(n+1).

Figure 2:
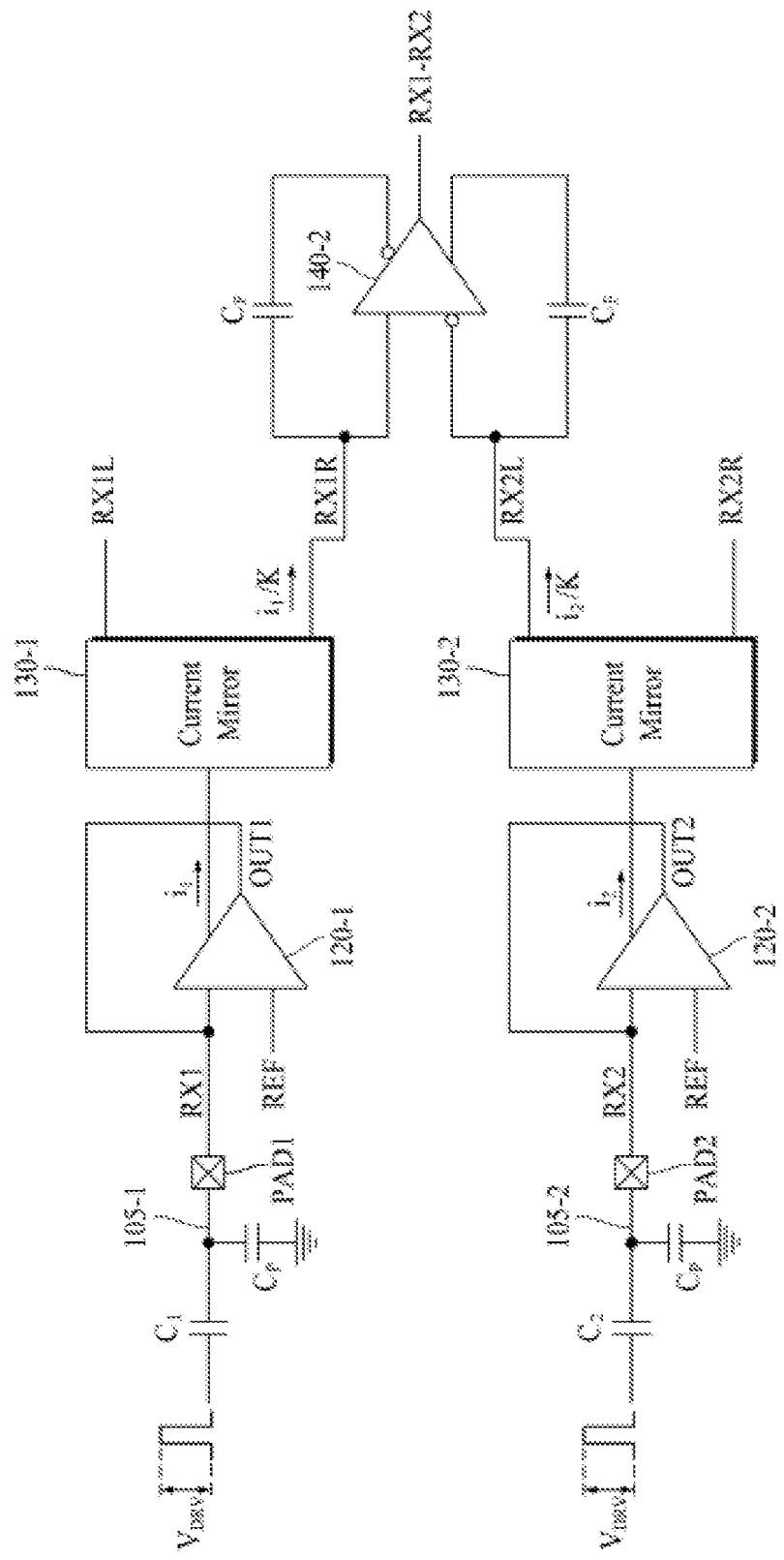
FIG. 2 is a circuit diagram for describing an operation of the touch sensing device illustrated in FIG. 1.

FIG. 2 is a circuit diagram for describing an operation of the touch sensing device illustrated in FIG. 1. In FIG. 2, for convenience of description, a configuration associated with the generating and processing of a first reception signal RX1 in the touch sensing device 110A illustrated in FIG. 1 will be mainly described.

When a first reception signal RX1 transmitted through a first pad PAD1 connected to a first touch sensing line 105-1 and a pulse VDRV corresponding to the reference signal REF are input to the first buffer 120-1, the first buffer 120-1 may output a current $i_1$ corresponding to a buffered signal BF1 to the first current mirror unit 130-1.

Moreover, when a second reception signal RX2 transmitted through a second pad PAD2 connected to a second touch sensing line 105-2 and the pulse VDRV corresponding to the reference signal REF are input to the second buffer 120-2, the second buffer 120-2 may output a current $i_2$ corresponding to a buffered signal BF2 to the second current mirror unit 130-2.

Here, $C_1$ and $C_2$ may denote a touch capacitance (or a touch capacitor) generated from a touch screen panel 103 touched by a finger of a user, $C_P$ may denote a parasitic capacitance (or a parasitic capacitor) of the touch screen panel 103, and $C_F$ may denote a feedback capacitor. K will be described below with reference to FIG. 3

In this case, the first current mirror unit 130-1 may output the mirror currents RX1L and RX1R, and the amounts of the mirror currents RX1L and RX1R may be the same, and thus, each of the mirror currents RX1L and RX1R may be expressed as the following Equation (1).

$$RX_{1L} = RX_{1R} = \frac{i_1}{K} \qquad \text{[Equation 1]}$$

The second current mirror unit 130-2 may output the mirror currents RX2L and RX2R, and the amounts of the mirror currents RX2L and RX2R may be the same, and thus, each of the mirror currents RX2L and RX2R may be expressed as the following Equation (2).

$$RX_{2L} = RX_{2R} = \frac{i_2}{K} \qquad \text{[Equation 2]}$$

The second integrator 140-2 may integrate a difference between the mirror current RX1R output from the first current mirror unit 130-1 and the mirror current RX2L output from the second current mirror unit 130-2 to provide output signal. The output signal may be a difference RX1-RX2 between a first reception signal RX1 and a second reception signal RX2 or a signal corresponding to the difference RX1-RX2.

Figure 3:
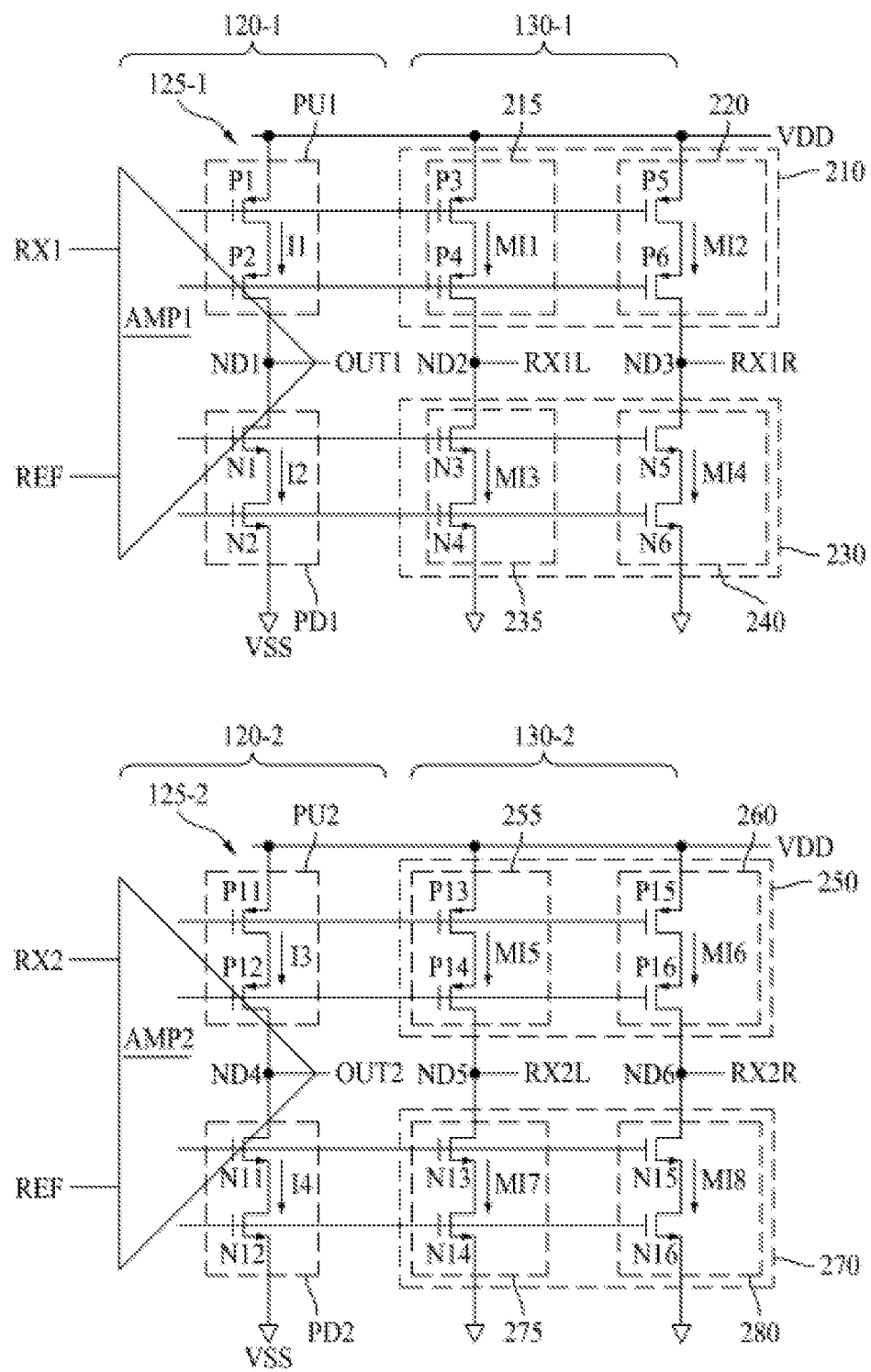
FIG. 3 is a circuit diagram illustrating a buffer and a current mirror unit each illustrated in FIGS. 1 and 2.

Hereinafter, an operation of each of a buffer and a current mirror unit according to an embodiment of the present invention will be described in detail with reference to FIGS. 1 to 3. FIG. 3 is a circuit diagram illustrating a buffer and a current mirror unit each illustrated in FIGS. 1 and 2. In FIG. 3, for convenience of description, only the first buffer 120-1, the first current mirror unit 130-1, the second buffer 120-2, and the second current mirror unit 130-2 are illustrated.

The first buffer 120-1 may include a first operational amplifier AMP1 and a first output circuit 125-1, and in order to configure a unit gain buffer, an output terminal ND1 of the first operational amplifier AMP1 may be connected to an input terminal, receiving the first reception signal RX1, of the first operational amplifier AMP1.

The first output circuit 125-1 may include a first pull-up circuit PU1 and a first pull-down circuit PD1. Each of the first pull-up circuit PU1 and the first pull-down circuit PD1 may be implemented as a cascode configuration.

The first pull-up circuit PU1 may include a plurality of PMOS transistors P1 and P2 serially connected between the output terminal ND1 and a first power line (or a power node) through which a first power VDD is provided, and in a pull-up operation (or a current sourcing operation), a first current I1 may flow to the output terminal ND1 through the first pull-up circuit PU1.

The first pull-down circuit PD1 may include a plurality of NMOS transistors N1 and N2 serially connected between the output terminal ND1 and a second power line through which a second power VSS is provided, and in a pull-down operation (or a current sinking operation), a second current I2 may flow to the second power line through the first pull-down circuit PD1.

The first current mirror unit 130-1 may include a first current mirror circuit 210 and a second current mirror circuit 230. The first current mirror circuit 210 may include a first mirror current generating circuit 215 and a second mirror current generating circuit 220, and the second current mirror circuit 230 may include a third mirror current generating circuit 235 and a fourth mirror current generating circuit 240.

The first current mirror circuit 210 may be implemented as a PMOS cascode current mirror circuit and may perform a mirroring operation on the first current I1 to generate a first mirror current MI1 and a second mirror current MI2. Each of the first mirror current generating circuit 215 and the second mirror current generating circuit 220 may be implemented as a PMOS cascode current mirror circuit.

The first mirror current generating circuit 215 may include a plurality of PMOS transistors P3 and P4 serially connected between a first mirror output terminal ND2 and the first power line through which the first power VDD is provided, and in a pull-up operation (or a current sourcing operation), the first mirror current MI1 may flow to the first mirror output terminal ND2 through the first mirror current generating circuit 215.

The second mirror current generating circuit 220 may include a plurality of PMOS transistors P5 and P6 serially connected between a second mirror output terminal ND3 and the first power line through which the first power VDD is provided, and in a pull-up operation (or a current sourcing operation), the second mirror current MI2 may flow to the second mirror output terminal ND3 through the second mirror current generating circuit 220.

The first pull-up circuit PU1 and the first mirror current generating circuit 215 may configure a current mirror, and the first pull-up circuit PU1 and the second mirror current generating circuit 220 may configure a current mirror.

The amount of the first current I1 may be higher than the amount of each of the first and second mirror currents MI1 and MI2, and the amount of the first mirror current MI1 may be the same as the amount of the second mirror current MI2.

For example, when it is assumed that lengths of channels of the PMOS transistors P1 to P6 are the same, widths of the channels of the PMOS transistors P1 and P2 are the same, widths of the channels of the PMOS transistors P3 to P6 are the same, and the width of the channel of the PMOS transistor P1 is K (where K is an integer of 2 or more) times the width of the channel of the PMOS transistor P3, the amount of each of the first and second mirror currents MI1 and MI2 may be 1/K times the amount of the first current I1.

Under such an assumption, when widths of the channels of the PMOS transistors P3 to P6 are capable of being adjusted by using control signals, the amount of each of the first and second mirror currents MI1 and MI2 may be adjusted.

The second current mirror circuit 230 may be implemented as an NMOS cascode current mirror circuit and may perform a mirroring operation on the second current I2 to generate a third mirror current MI3 and a fourth mirror current MI4. Each of the third mirror current generating circuit 235 and the fourth mirror current generating circuit 240 may be implemented as an NMOS cascode current mirror circuit.

The third mirror current generating circuit 235 may include a plurality of NMOS transistors N3 and N4 serially connected between the first mirror output terminal ND2 and the second power line through which the second power VSS, and in a pull-down operation (or a current sinking operation), the third mirror current MI3 may flow to the second power line through the third mirror current generating circuit 235. Accordingly, a first output signal RX1L corresponding to a difference between the first mirror current MI1 and the third mirror current MI3 may be output through the first mirror output terminal ND2.

The fourth mirror current generating circuit 240 may include a plurality of NMOS transistors N5 and N6 serially connected between the second mirror output terminal ND3 and the second power line through which the second power VSS, and in a pull-down operation (or a current sinking operation), the fourth mirror current MI4 may flow to the second power line through the fourth mirror current generating circuit 240. Accordingly, a second output signal RX1R corresponding to a difference between the second mirror current MI2 and the fourth mirror current MI4 may be output through the second mirror output terminal ND3.

The first pull-down circuit PD1 and the third mirror current generating circuit 235 may configure a current mirror, and the first pull-down circuit PD1 and the fourth mirror current generating circuit 240 may configure a current mirror.

The amount of the second current I2 may be higher than the amount of each of the third and fourth mirror currents MI3 and MI4, and the amount of the third mirror current MI3 may be the same as the amount of the fourth mirror current MI4.

For example, when it is assumed that lengths of channels of the NMOS transistors N1 to N6 are the same, widths of the channels of the NMOS transistors N1 and N2 are the same, widths of the channels of the NMOS transistors N3 to N6 are the same, and the width of the channel of the NMOS transistor N1 is K times the width of the channel of the NMOS transistor N3, the amount of each of the third and fourth mirror currents MI3 and MI4 may be 1/K times the amount of the second current I2.

Under such an assumption, when widths of the channels of the NMOS transistors N3 to N6 are capable of being adjusted by using control signals, the amount of each of the third and fourth mirror currents MI3 and MI4 may be adjusted.

The second buffer 120-2 may include a second operational amplifier AMP2 and a second output circuit 125-2, and in order to configure a unit gain buffer, an output terminal ND4 of the second operational amplifier AMP2 may be connected to an input terminal, receiving the second reception signal RX2, of the second operational amplifier AMP2.

The second output circuit 125-2 may include a second pull-up circuit PU2 and a second pull-down circuit PD2. Each of the second pull-up circuit PU2 and the second pull-down circuit PD2 may be implemented as a cascode configuration.

The second pull-up circuit PU2 may include a plurality of PMOS transistors P11 and P12 serially connected between the output terminal ND4 and the first power line through which the first power VDD is provided, and in a pull-up operation (or a current sourcing operation), a third current I3 may flow to the output terminal ND4 through the second pull-up circuit PU2.

The second pull-down circuit PD2 may include a plurality of NMOS transistors N11 and N12 serially connected between the output terminal ND4 and the second power line through which the second power VSS is provided, and in a pull-down operation (or a current sinking operation), a fourth current I4 may flow to the second power line through the second pull-down circuit PD2.

The second current mirror unit 130-2 may include a third current mirror circuit 250 and a fourth current mirror circuit 270. The third current mirror circuit 250 may include a fifth mirror current generating circuit 255 and a sixth mirror current generating circuit 260, and the fourth current mirror circuit 270 may include a seventh mirror current generating circuit 275 and an eighth mirror current generating circuit 280.

The third current mirror circuit 250 may be implemented as a PMOS cascode current mirror circuit and may perform a mirroring operation on the third current I3 to generate a fifth mirror current MI5 and a sixth mirror current MI6. Each of the fifth mirror current generating circuit 255 and the sixth mirror current generating circuit 260 may be implemented as a PMOS cascode current mirror circuit.

The fifth mirror current generating circuit 255 may include a plurality of PMOS transistors P13 and P14 serially connected between a third mirror output terminal ND5 and the first power line through which the first power VDD is provided, and in a pull-up operation (or a current sourcing operation), the fifth mirror current MI5 may flow to the third mirror output terminal ND5 through the fifth mirror current generating circuit 255.

The sixth mirror current generating circuit 260 may include a plurality of PMOS transistors P15 and P16 serially connected between a fourth mirror output terminal ND6 and the first power line through which the first power VDD is provided, and in a pull-up operation (or a current sourcing operation), the fifth mirror current MI5 may flow to the fourth mirror output terminal ND6 through the sixth mirror current generating circuit 260.

The second pull-up circuit PU2 and the fifth mirror current generating circuit 255 may configure a current mirror, and the second pull-up circuit PU2 and the sixth mirror current generating circuit 260 may configure a current mirror.

The amount of the third current I3 may be higher than the amount of each of the fifth and sixth mirror currents MI5 and MI6, and the amount of the fifth mirror current MI5 may be the same as the amount of the sixth mirror current MI6.

For example, when it is assumed that lengths of channels of the PMOS transistors P11 to P16 are the same, widths of the channels of the PMOS transistors P11 and P12 are the same, widths of the channels of the PMOS transistors P13 to P16 are the same, and the width of the channel of the PMOS transistor P11 is K times the width of the channel of the PMOS transistor P13, the amount of each of the fifth and sixth mirror currents MI15 and MI16 may be 1/K times the amount of the third current 13.

Under such an assumption, when widths of the channels of the PMOS transistors P13 to P16 are capable of being adjusted by using control signals, the amount of each of the fifth and sixth mirror currents MI15 and MI16 may be adjusted.

The fourth current mirror circuit 270 may be implemented as an NMOS cascode current mirror circuit and may perform a mirroring operation on the fourth current 14 to generate a seventh mirror current MI7 and an eighth mirror current MI8. Each of the seventh mirror current generating circuit 275 and the eighth mirror current generating circuit 280 may be implemented as an NMOS cascode current mirror circuit. It may be assumed that the fifth mirror current MI5 is the same as the seventh mirror current MI7 and the sixth mirror current MI6 is the same as the eighth mirror current MI8.

The seventh mirror current generating circuit 275 may include a plurality of NMOS transistors N13 and N14 serially connected between the third mirror output terminal ND5 and the second power line through which the second power VSS, and in a pull-down operation (or a current sinking operation), the seventh mirror current MI17 may flow to the second power line through the seventh mirror current generating circuit 275. Accordingly, a third output signal RX2L corresponding to a difference between the fifth mirror current MI5 and the seventh mirror current MI7 may be output through the third mirror output terminal ND5.

The eighth mirror current generating circuit 280 may include a plurality of NMOS transistors N15 and N16 serially connected between the fourth mirror output terminal ND6 and the second power line through which the second power VSS, and in a pull-down operation (or a current sinking operation), the eighth mirror current MI8 may flow to the second power line through the eighth mirror current generating circuit 280. Accordingly, a fourth output signal RX2R corresponding to a difference between the sixth mirror current MI6 and the eighth mirror current MI8 may be output through the fourth mirror output terminal ND6.

The second pull-down circuit PD2 and the seventh mirror current generating circuit 275 may configure a current mirror, and the second pull-down circuit PD2 and the eighth mirror current generating circuit 280 may configure a current mirror.

The amount of the fourth current 14 may be higher than the amount of each of the seventh and eighth mirror currents MI7 and MI8, and the amount of the seventh mirror current MI7 may be the same as the amount of the eighth mirror current MI8.

For example, when it is assumed that lengths of channels of the NMOS transistors N11 to N16 are the same, widths of the channels of the NMOS transistors N11 and N12 are the same, widths of the channels of the NMOS transistors N13 to N16 are the same, and the width of the channel of the NMOS transistor N11 is K times the width of the channel of the NMOS transistor N13, the amount of each of the seventh and eighth mirror currents MI7 and MI8 may be 1/K times the amount of the fourth current 14.

Under such an assumption, when widths of the channels of the NMOS transistors N13 to N16 are capable of being adjusted by using control signals, the amount of each of seventh and eighth the mirror currents MI7 and MI8 may be adjusted.

According to the above embodiment, the second output signal RX1R generated by the first current mirror unit 130-1 and the third output signal RX2L generated by the second current mirror unit 130-2 are input to the integrator 140-2 and thus, the integrator 140-2 performs differential operation on the second output signal RX1R and the third output signal RX2L.

As described above, since each of the output circuits 125-1 and 125-2 and the current mirror units 130-1 and 130-2 is implemented as a cascode current mirror, a direct current (DC) current mismatch of MOS transistors configuring each of the current mirror units 130-1 and 130-2 may be minimized, and thus, a DC current accumulated into each integrator may be minimized. Accordingly, an output range of each integrator may be efficiently used, distortion of differential signals may be removed or considerably reduced, and a function of removing common noise caused by a mismatch with adjacent transmission channels may be enhanced.

Figure 4:
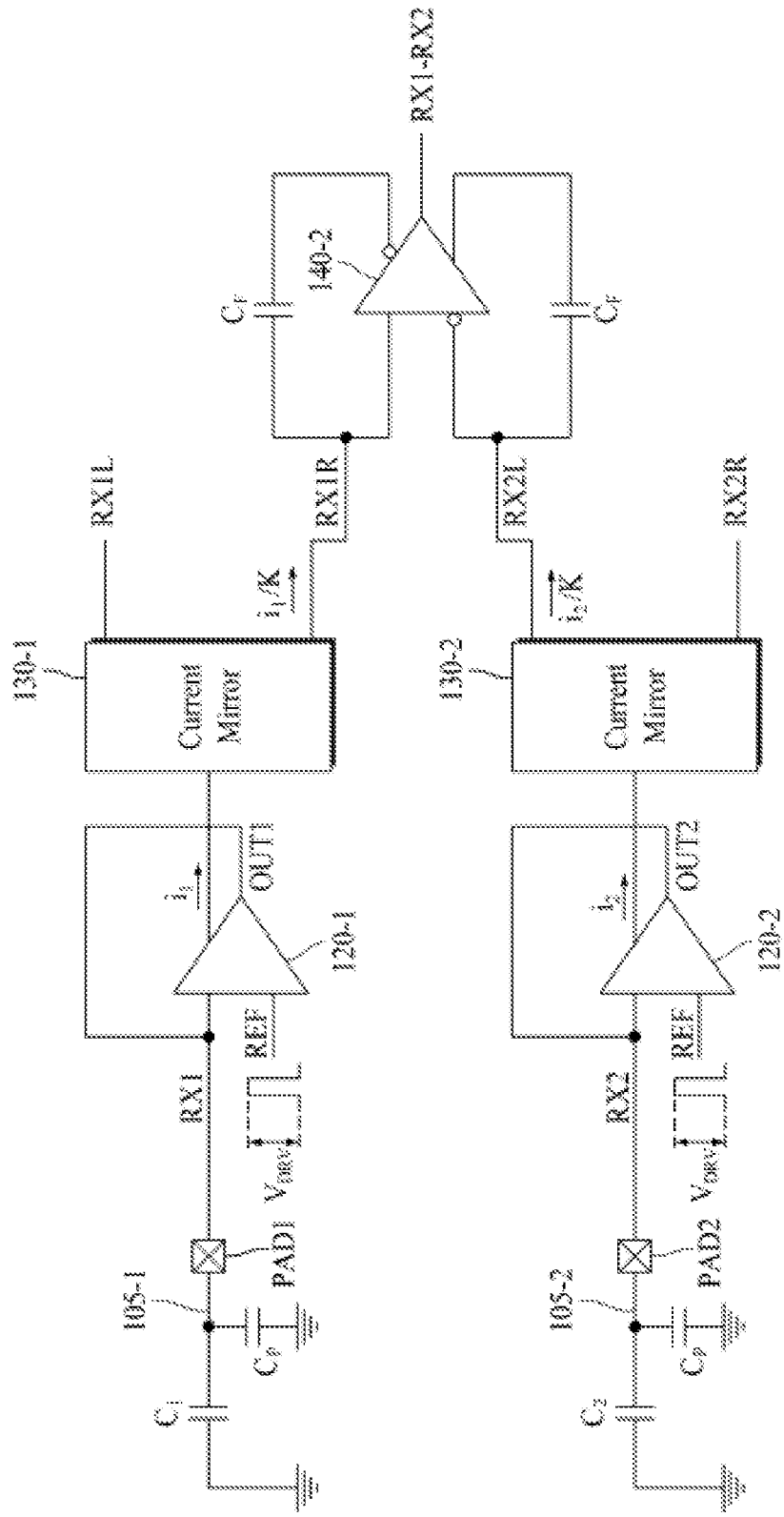
FIG. 4 is a circuit diagram for describing self-capacitance sensing by using a touch sensing device according to an embodiment of the present invention.

In the above embodiments, it is described that the touch sensing device according to an embodiment of the present invention senses mutual capacitance. However, the touch sensing device according to an embodiment of the present invention can be used to sense self-capacitance as illustrated in FIG. 4. Comparing the touch sensing device illustrated in FIG. 4 with the touch sensing device illustrated in FIG. 2, it is just different that the touch driving signal VDRV is directly input to noninverting terminal of buffers 120-1-120-$n$ and the other elements and operations are same. Thus, the detailed description about the touch sensing device of FIG. 4 will be omitted.

Figure 5:
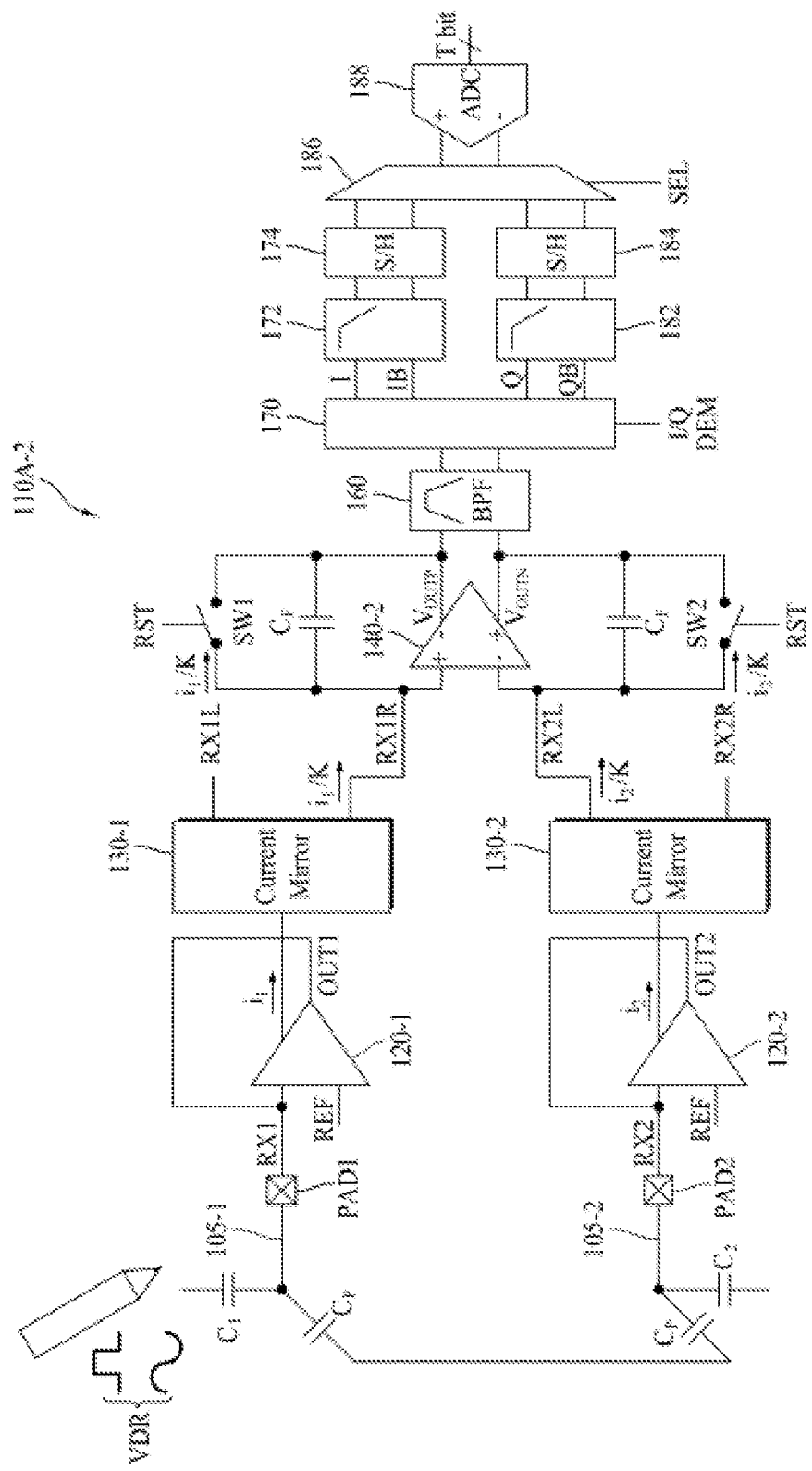
FIG. 5 is a block diagram of a display apparatus including a touch sensing device and an I/Q demodulator according to another embodiment of the present invention.

FIG. 5 is a block diagram of a display apparatus including a touch sensing device and an in-phase/quadrature demodulator according to another embodiment of the present invention. Referring to FIGS. 2 and 5, the touch sensing device 110A-2 of FIG. 5 further include a plurality of reset switches SW1 and SW2 for respectively resetting feedback capacitors CF, a band pass filter 160, an I/Q demodulator 170, an I channel gain control and low pass filter 172, a first sample and hold circuit 174, a Q channel gain control and low pass filter 182, a second sample and hold circuit 184, a multiplexer 186, and an analog-to-digital converter 188, in addition to the elements 120-1, 120-2, 130-1, 130-2, 140-2, and $C_F$ of the touch sensing device 110A of FIG. 2.

Each of the reset switches SW1 and SW2 may respectively initialize the feedback capacitors $C_F$ in response to a reset signal RST.

The band pass filter 160 may receive the output signals $V_{OUTP}$ and $V_{OUTN}$ of the integrator 140-2, may perform band pass filtering on the output signals $V_{OUTP}$ and $V_{OUTN}$, and may output band-pass-filtered signals to the I/Q demodulator 170.

The I/Q demodulator 170 may generate in-phase differential signals I and IB and quadrature differential signals Q and QB from the band-pass-filtered signals. Here, I may denote an in-phase component, and Q may denote a quadrature component.

The I channel gain control and low pass filter 172 may control a gain of each of the in-phase differential signals I and IB, may perform low pass filtering on gain-controlled in-phase differential signals, and may output low-pass-filtered in-phase differential signals to the first sample and hold circuit 174. The first sample and hold circuit 174 may perform a sampling operation and a holding operation on the low-pass-filtered in-phase differential signals.

The Q channel gain control and low pass filter 182 may control a gain of each of the quadrature differential signals Q and QB, may perform low pass filtering on gain-controlled quadrature differential signals, and may output low-pass-filtered quadrature differential signals to the second sample and hold circuit 184. The second sample and hold circuit 184 may perform a sampling operation and a holding operation on the low-pass-filtered quadrature differential signals.

The multiplexer 186 may provide output signals of the first sample and hold circuit 174 or output signals of the second sample and hold circuit 184 to the analog-to-digital converter 188 in response to selection signals SEL. The analog-to-digital converter 188 may output output signals of the multiplexer 186 as T-bit digital signals. Here, T may be an integer of 2 or more.

Referring to FIGS. 2 and 5, it may be assumed in FIG. 5 that the touch screen panel 103 is touched by an active pen PEN. A phase of a frequency of a driving signal (for example, a sine wave or a square wave) for the active pen PEN may be asynchronous with a phase of a frequency of the reference signal REF supplied to each of the buffers 120-1 and 120-2. Although the phase of the frequency of the driving signal for the active pen PEN is asynchronous with the phase of the frequency of the reference signal REF supplied to each of the buffers 120-1 and 120-2, the touch sensing device 110A-2 including the elements illustrated in FIG. 5 may sense, by using the I/Q demodulator 170, that the active pen PEN touches the touch screen panel 103.

The elements included in the touch sensing devices 110A and 110A-2 described above with reference to FIGS. 1 to 5 may configure a touch sensing circuit for sensing a touch applied to the touch screen panel 103, and the touch sensing circuit may be implemented (or provided) in an analog front end (AFE).

According to the embodiments of the present invention, since a first stage is configured with a buffer and a current mirror unit and a second stage is configured with a sensing amplifier for differentially sensing outputs of current mirror units of adjacent channels, display noise and external noise occurring in common may be effectively removed.

Moreover, according to the embodiments of the present invention, since the buffers implemented in the touch sensing device are respectively connected to the touch sensing lines of the touch screen panel, an additional circuit (for example, a multiplexer) may not be needed between each of the buffers and a corresponding touch sensing line of the touch sensing lines.

Moreover, according to the embodiments of the present invention, since the buffers implemented in the touch sensing device are respectively connected to the touch sensing lines of the touch screen panel, signals may be simultaneously generated or processed in all channels. Accordingly, comparing with a conventional time sequence manner where a touch sensing device sequentially senses signals of channels, an increase in a sensing time may be reduced, and the degradation in signal quality caused by a time sequence-based sensing time difference may be reduced.

Moreover, according to the embodiments of the present invention, since the first stage is configured with buffers, a limitation of a feedback factor based on a high capacitance load may be reduced, and thus, it may be easy to design a sensing amplifier and it may not be required to increase a feedback capacitor, thereby minimizing an increase in a design area and a reduction in an output signal of the sensing amplifier.

Moreover, according to the embodiments of the present invention, a gain of an output signal in the second stage may be adjusted by using a current mirror unit included in the first stage, and thus, a value of a feedback capacitor of a sensing amplifier included in the second stage may be reduced, thereby maximizing the design area efficiency of the sensing amplifier.

Moreover, according to the embodiments of the present invention, a reference signal for single-ended conversion may be selectively used in a first sensing amplifier and a last sensing amplifier, and thus, each of differential signals may be converted into a single-ended signal by selectively using a channel, where noise or a touch does not occur, of both channels.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A touch sensing device comprising:
a plurality of buffers, each buffer of the plurality of buffers adapted to buffer a difference between a reference signal and a reception signal received from a touch electrode through a touch sensing line and generate first and second currents corresponding to a buffered signal;
a plurality of current mirror units respectively connected to the plurality of buffers, each current mirror unit of the plurality of current mirror units adapted to generate a first output signal using a first mirror current generated through mirroring of the first current and a third mirror current generated through mirroring of the second current, and generate a second output signal using a second mirror current generated through mirroring of the first current and a fourth mirror current generated through mirroring of the second current; and
a plurality of integrators, each integrator of the plurality of integrators adapted to integrate a difference between the first output signal output from an $n^{th}$ (where n is an integer of 2 or more) current mirror unit of the plurality of current mirror units and the second output signal output from an $(n-1)^{th}$ current mirror unit of the plurality of current mirror units;
wherein a first integrator of the plurality of integrators is adapted to integrate a difference between a predetermined reference signal and a first output signal output from a first current mirror unit of the plurality of current mirror units; and
wherein a last integrator of the plurality of integrators is adapted to integrate a difference between the predetermined reference signal and a second output signal output from a last current mirror unit of the plurality of current mirror units.

2. The touch sensing device of claim 1, wherein each of the plurality of buffers comprises:
   an operational amplifier including an inverting input terminal connected to the touch sensing line to receive the reception signal, a noninverting input terminal receiving the reference signal, and an output terminal connected to the inverting input terminal; and
   an output circuit including a pull-up circuit disposed between a first power line and the output terminal to allow the first current to flow and a pull-down circuit disposed between a second power line and the output terminal to allow the second current to flow.

3. The touch sensing device of claim 2, wherein each of the pull-up circuit and the pull-down circuit is a circuit having a cascode configuration including a plurality of MOS transistors serially connected to each other.

4. The touch sensing device of claim 2, wherein
   the pull-up circuit is a PMOS cascode circuit including two PMOS transistors serially connected to each other, and
   the pull-down circuit is an NMOS cascode circuit including two NMOS transistors serially connected to each other.

5. The touch sensing device of claim 1, wherein
   each of the plurality of current mirror units comprises:
   a first mirror current generating circuit disposed between a first power line and a first mirror output terminal to generate the first mirror current by performing a mirroring operation on the first current;
   a second mirror current generating circuit disposed between the first power line and a second mirror output terminal to generate the second mirror current by performing a mirroring operation on the first current;
   a third mirror current generating circuit disposed between a second power line and the first mirror output terminal to generate the third mirror current by performing a mirroring operation on the second current; and
   a fourth mirror current generating circuit disposed between the second power line and the second mirror output terminal to generate the fourth mirror current by performing a mirroring operation on the second current,
   the first output signal is output through the first mirror output terminal, and
   the second output signal is output through the second mirror output terminal.

6. The touch sensing device of claim 5, wherein each of the first to fourth mirror current generating circuits is a circuit having a cascode configuration including a plurality of MOS transistors serially connected to each other.

7. The touch sensing device of claim 5, wherein
   each of the first and second mirror current generating circuits is a PMOS cascode circuit including two PMOS transistors serially connected to each other, and
   each of the third and fourth mirror current generating circuits is an NMOS cascode circuit including two NMOS transistors serially connected to each other.

8. The touch sensing device of claim 1, wherein each of the first and second mirror currents is 1/K (where K is an integer of 2 or more) times the first current, and each of the third and fourth mirror currents is 1/K times the second current.

9. The touch sensing device of claim 1, further comprising:
   a band pass filter receiving and filtering an output of a corresponding integrator of the plurality of integrators; and
   an I/Q demodulator demodulating an output signal of the band pass filter to generate an in-phase (I) signal and a quadrature (Q) signal.

10. A touch sensing device comprising:
    a first buffer connected to a first touch electrode through a first touch sensing line, the first buffer including a first output circuit including a first pull-up circuit having a cascode configuration and a first pull-down circuit having a cascode configuration;
    a first PMOS cascode mirror current generating circuit connected to the first buffer to generate a first mirror current by performing a mirroring operation on a first current flowing through the first pull-up circuit;
    a first NMOS cascode mirror current generating circuit connected to the first buffer to generate a third mirror current by performing a mirroring operation on a second current flowing through the first pull-down circuit;
    a second buffer connected to a second touch electrode through a second touch sensing line, the second buffer including a second output circuit including a second pull-up circuit having a cascode configuration and a second pull-down circuit having a cascode configuration;
    a second PMOS cascode mirror current generating circuit connected to the second buffer to generate a second mirror current by performing a mirroring operation on a first current flowing through the second pull-up circuit;
    a second NMOS cascode mirror current generating circuit connected to the second buffer to generate a fourth mirror current by performing a mirroring operation on a second current flowing through the second pull-down circuit; and
    an integrator adapted to integrate a difference between a predetermined reference signal and a first output signal generated by using the first mirror current and the third mirror current,
    wherein the integrator is adapted to receive a second output signal as the predetermined reference signal, and the second output signal is generated by using the second mirror current and the fourth mirror current.

11. The touch sensing device of claim 10, wherein each of the first and second mirror currents is 1/K (where K is an integer of 2 or more) times the first current, and each of the third and fourth mirror currents is 1/K times the second current.

12. The touch sensing device of claim 10, further comprising:
    a band pass filter receiving and filtering an output of the integrators; and
    an I/Q demodulator demodulating an output signal of the band pass filter to generate an in-phase (I) signal and a quadrature (Q) signal.

13. A display apparatus comprising:
    a touch screen panel including a plurality of touch electrodes and a plurality of touch sensing lines connected to the plurality of touch electrodes to each transmit a reception signal corresponding to a capacitance generated in a corresponding touch electrode; and
    a touch sensing device connected to the plurality of touch sensing lines to sense whether a touch is applied thereto,
    wherein the touch sensing device comprises:
    a first buffer connected to a first touch electrode through a first touch sensing line, the first buffer including a first output circuit including a first pull-up circuit having a cascode configuration and a first pull-down circuit having a cascode configuration;

a first PMOS cascode mirror current generating circuit connected to the first buffer to generate a first mirror current by performing a mirroring operation on a first current flowing through the first pull-up circuit;

a first NMOS cascode mirror current generating circuit connected to the first buffer to generate a third mirror current by performing a mirroring operation on a second current flowing through the first pull-down circuit;

a second buffer connected to a second touch electrode through a second touch sensing line, the second buffer including a second output circuit including a second pull-up circuit having a cascode configuration and a second pull-down circuit having a cascode configuration;

a second PMOS cascode mirror current generating circuit connected to the second buffer to generate a second mirror current by performing a mirroring operation on a first current flowing through the second pull-up circuit;

a second NMOS cascode mirror current generating circuit connected to the second buffer to generate a fourth mirror current by performing a mirroring operation on a second current flowing through the second pull-down circuit; and an integrator integrating a difference between a predetermined reference signal and a first output signal generated by using the first mirror current and the third mirror current, wherein the integrator is adapted to receive a second output signal as the predetermined reference signal, and the second output signal is generated by using the second mirror current and the fourth mirror current.

14. The display apparatus of claim 13, wherein each of the first and second mirror currents is 1/K (where K is an integer of 2 or more) times the first current, and each of the third and fourth mirror currents is 1/K times the second current.

15. The display apparatus of claim 13, wherein the touch sensing device further comprises:

a band pass filter receiving and filtering an output of the integrator; and an I/Q demodulator demodulating an output signal of the band pass filter to generate an in-phase (I) signal and a quadrature (Q) signal.

16. The display apparatus of claim 13, wherein the touch sensing device is adapted to supply a touch driving signal to the touch electrodes.

17. The display apparatus of claim 13, wherein the touch screen panel further comprises a plurality of touch driving lines for supplying a touch driving signal to the electrodes, and wherein the touch sensing device is adapted to generate the touch driving signal to supply the touch driving signal to the touch driving lines.

* * * * *